United States Patent [19]

McBride et al.

[11] Patent Number: 5,439,849
[45] Date of Patent: Aug. 8, 1995

[54] ENCAPSULATION TECHNIQUES WHICH INCLUDE FORMING A THIN GLASS LAYER ONTO A POLYMER LAYER

[75] Inventors: Richard McBride, Trenton; Ching-Ping Wong, Lawrenceville, both of N.J.

[73] Assignee: AT&T Corp., Murray Hill, N.J.

[21] Appl. No.: 191,378

[22] Filed: Feb. 2, 1994

[51] Int. Cl.⁶ .......................................... H01L 21/56
[52] U.S. Cl. ............................................... 437/219
[58] Field of Search ............... 257/790, 791, 792, 794; 437/207, 219

[56] References Cited

U.S. PATENT DOCUMENTS

| | | | |
|---|---|---|---|
| 3,996,602 | 12/1976 | Goldberg et al. | 356/72 |
| 4,017,340 | 4/1977 | Yerman | 148/33.3 |
| 4,040,874 | 8/1977 | Yerman | 148/33.3 |
| 4,278,784 | 7/1981 | Wong | 528/27 |
| 4,604,144 | 8/1986 | Wong | 134/28 |
| 4,869,755 | 9/1989 | Huschka et al. | 136/259 |
| 5,013,691 | 5/1991 | Lory et al. | 437/238 |
| 5,208,467 | 5/1993 | Yamazaki | 257/667 |
| 5,215,801 | 6/1993 | Wong | 428/76 |

*Primary Examiner*—R. Bruce Breneman
*Assistant Examiner*—Matthew Whipple
*Attorney, Agent, or Firm*—Roderick B. Anderson

[57] ABSTRACT

An encapsulant comprised of alternate layers of polymer and glass gives enhanced protection to semiconductor integrated circuit devices, which is much more effective than either glass or polymer encapsulations by themselves. In one embodiment, a semiconductor device (11) is covered by a polymer layer (13), the polymer layer being covered by a glass layer (14), and the glass layer being covered by a second polymer layer (15). The glass is preferably deposited by a plasma enhanced chemical vapor deposition apparatus (17 of FIG. 2).

6 Claims, 2 Drawing Sheets

ENCAPSULATION TECHNIQUES WHICH INCLUDE FORMING A THIN GLASS LAYER ONTO A POLYMER LAYER

TECHNICAL FIELD

This invention relates to electronic device encapsulants and, more particularly, to polymer encapsulants for semiconductor devices.

Background of the Invention

Because of the relative expense and bulk of hermetically sealed packages for integrated circuits, considerable effort has been made to provide encapsulants for integrated circuits which are not hermetically sealed, but nevertheless provide appropriate protection, particularly under conditions of high temperature, high humidity, and relatively high bias voltages on the integrated circuit. The patent of Wong, No. 5,215,801, granted Jun. 1, 1992, is an example of the literature describing silicone polymer as an integrated circuit encapsulant. Because of its elastomeric consistency, silicone also gives a certain degree of shock resistance to the integrated circuit chip. Glass has also been proposed as an encapsulant for integrated circuits, but glass is susceptible to pinhole defects and microcracking, which might permit water molecules to reach the protected integrated circuit.

While silicone encapsulants are widely used and are perfectly adequate for many purposes, they are still sometimes inadequate for protecting integrated circuit chips that have closely spaced conductors, carry relatively high voltages, or for some other reason are particularly susceptible to atmospheric conditions of high humidity and temperature.

SUMMARY OF THE INVENTION

We have found that an encapsulant comprised of alternate layers of polymer and glass gives enhanced protection to semiconductor integrated circuit devices which is much more effective than either glass or polymer encapsulations by themselves. In one embodiment, the semiconductor device is covered by a polymer layer, the polymer layer is covered by a glass layer, and the glass layer is covered by another polymer layer. The glass is preferably deposited by plasma enhanced chemical vapor deposition, as will be described later.

In other embodiments, the first layer may be glass, or the encapsulation may comprise only two layers, one of polymer and one of glass. Experimental testing shows that under conditions of high temperature and humidity, and high electrical bias, such encapsulants are effective in giving long-term protection without the need for hermeticity.

These and other objects, features and benefits of the invention will be better understood from a consideration of the following detailed description taken in conjunction with the accompanying drawing.

DETAILED DESCRIPTION

Figure 1:
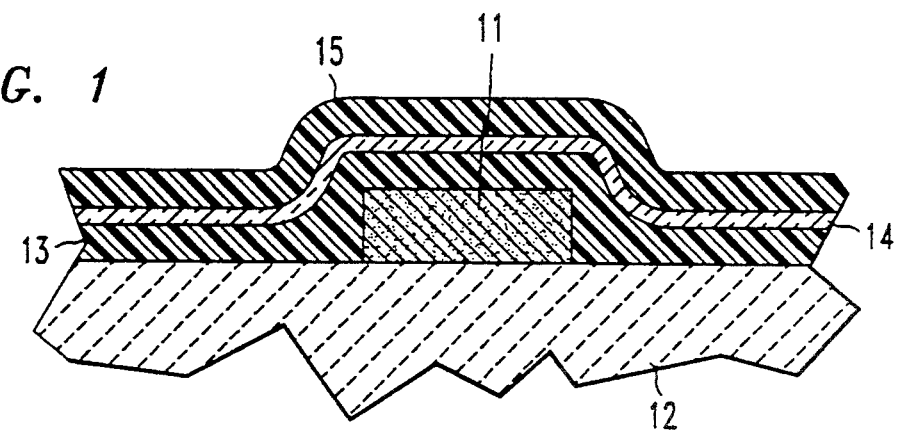
FIG. 1 is a schematic sectional view of a semiconductor integrated circuit encapsulated in accordance with an illustrative embodiment of the invention.

Referring now to FIG. 1, there is shown a semiconductor integrated circuit device 11 surface mounted on a substrate 12 which, as is known, may be of a material such as silicon or ceramic. The integrated circuit 11 conducts electrical signals on an arrangement of conductive paths on its surface and transmits them to conductors (not shown) on the substrate 12. The proper functioning of the device requires that it be protected from atmospheric contaminants, particularly water vapor. For this purpose, in accordance with one embodiment of the invention, an encapsulation is used comprising a first layer 13 of polymer applied directly to the semiconductor device, a second layer 14 of glass, and a third layer 15 of polymer.

The polymer layers 13 and 15 are preferably selected from the group consisting of polyimide and silicone resin. If the layers are of silicone resin, they are preferably applied by flow coating to a thickness of 0.5 to two mils (twelve to fifty micrometers). If either layer is of polyimide, it preferably has a thickness of five to twenty-five micrometers. The glass layer 14 is preferably selected from the group consisting of silicon dioxide ($SiO_2$), silicon nitride (SIN) and silicon oxynitride (SION). It is preferably deposited by a form of chemical vapor deposition known as plasma enhanced chemical vapor deposition to a thickness of five hundred to five thousand angstroms (fifty to five hundred nanometers).

The first layer 13 may be an RTV (room-temperature vulcanizable) elastomer silicone resin comprising hydroxy-terminated polydimethylsiloxane crosslinked with trimethoxysilane. It may be applied by spin coating the substrate 12 at a rate of one thousand five hundred rpm. This type of silicone resin cures at room temperature to a consistency similar to that of rubber. It therefore offers production advantages over heat-curable silicone, and provides shock resistance to the semiconductor chip.

Figure 2:
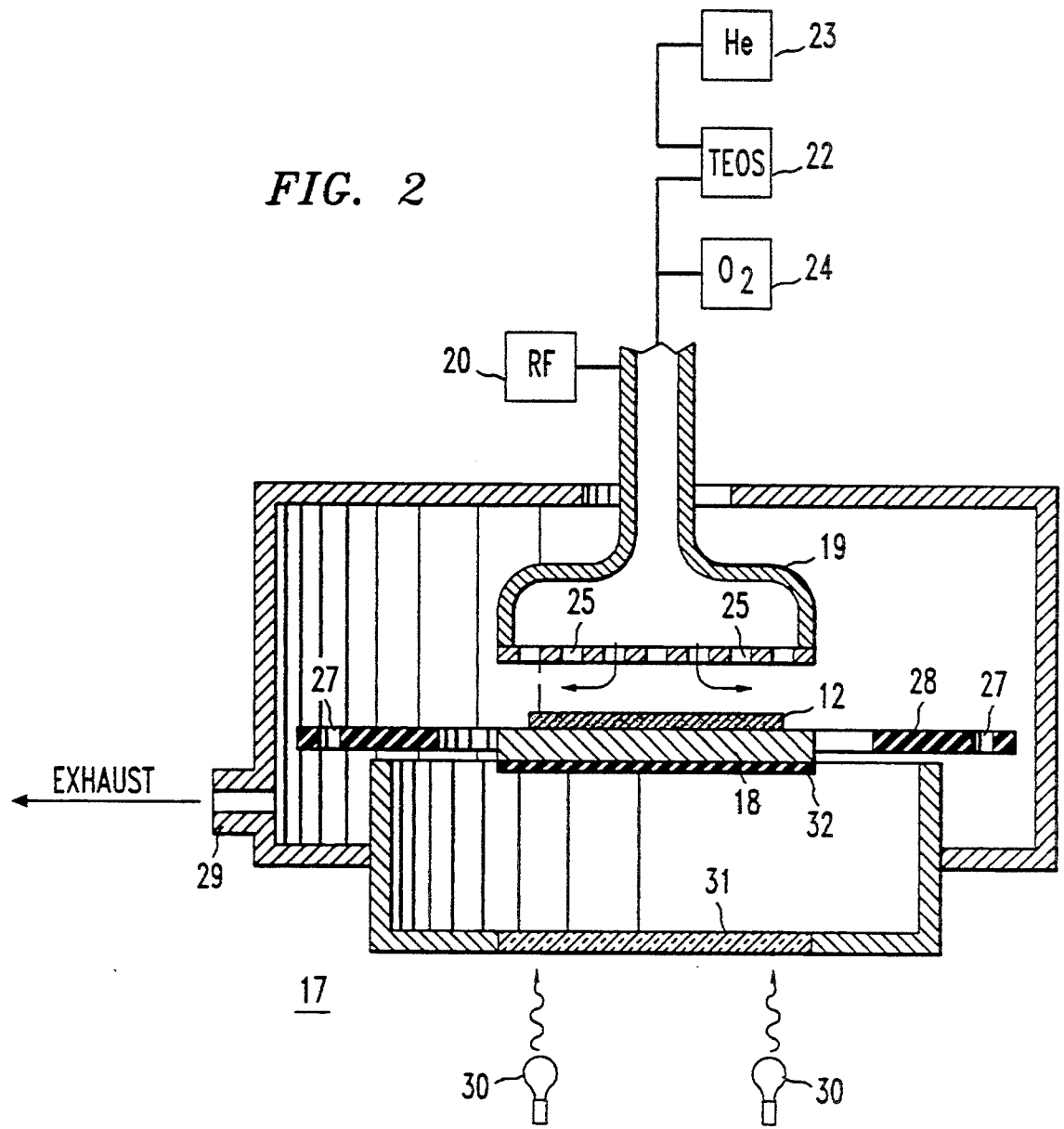
FIG. 2 is a schematic sectional view of apparatus for depositing glass to be used in the encapsulation of the apparatus of FIG. 1.

Over the layer 13, the layer 14 is applied, for example, by a plasma deposition reactor 17 shown in FIG. 2, which may be of the general type known as the "Precision 5000 System," commercially available from the Applied Materials Company, Santa Clara, Calif. The reactor includes opposite generally parallel electrodes 18 and 19 between which a radio frequency plasma is formed. The electrode 19 is excited with radio frequency energy typically of 13.5 megahertz from a radio frequency source 20. Electrode 18 is grounded and supports the substrate 12 of FIG. 1 which is to be coated with silicon dioxide glass.

The silicon component of $SiO_2$ to be deposited from the plasma is obtained from gaseous tetraethoxysilane (TEOS) derived from a heated liquid source 22. Typically, TEOS is commercially available as a liquid, and a vaporized form may be obtained by bubbling helium from a source 23 through the liquid TEOS and directing vaporized molecules from the TEOS container into the reactor, as indicated schematically. Also included in the plasma atmosphere is oxygen gas, which may be derived from a source 24.

The rf driven electrode 19 is hollow and contains a plurality of apertures 25 that permit the flow of injected gas, as shown by the arrows. The gas thus flows radially over the surface of substrate 12 and is guided through apertures 27 in a plate 28 to an annular vacuum channel from which it is withdrawn through an exhaust 29. The lower electrode 18 is heated by a plurality of lamps 30 that direct light through a quartz window 31 so as to impinge on an aluminum oxide layer 32. This heats the electrode 18 to a temperature below the melting point of any metal conductors contained on the substrate 12. The purpose of the radio frequency plasma is to ionize and thereby to provide sufficient additional energy to molecules of the atmosphere to permit chemical vapor deposition of silicon oxide on the surface of the substrate 12 from the silicon and oxygen components of the atmosphere. This process is known as plasma enhanced chemical vapor deposition and can also be used, as is known in the art, for depositing silicon nitride, silicon oxynitride and other glass forms. Glass layers five hundred to five thousand angstroms thick can easily and routinely be made using the PECVD process, which is in general and widespread use in the fabrication of semiconductor wafers.

After the glass layer has formed, the third polymer layer 15 may be formed in the same manner as layer 13. For example, both layers 13 and 15 may be RTV silicone resin. Alternatively, either layer or both layers 13 and 15 may be of a different silicone resin, or of polyimide, or of various other polymers.

We have found that the encapsulation of FIG. 1 is significantly better than an encapsulation only of glass or only of polymer. We believe that the reason for this is that glass provides significant protection along most of the covered area, but inherently admits contaminants through localized areas such as pinhole defects. Polymer, on the other hand, provides a more homogeneous and uniform protection; contaminants that it does admit penetrate more or less uniformly along the surface area of the polymer. Consequently, with both glass and polymer, only the areas in which the glass has defects permit contaminants to reach the polymer layer 13. The protection of polymer layer 13 is, in turn, quite dependable and uniform, and few of the contaminants that reach it can penetrate it.

The encapsulation of FIG. 1 was tested by using the triple track test circuit described in detail in the U.S. patent of Wong, No. 4,604,144, granted Aug. 5, 1986, incorporated by reference herein. This circuit comprises three fine closely spaced conductors of tantalum nitride on an aluminum substrate. The conductors and spaces between them are approximately three mils in width. The test circuits are coated with the encapsulant being tested and are electrically connected to a power supply and placed in a jar within an oven chamber. Circuits are then exposed to a high temperature of eighty-five degrees Centigrade, a high relative humidity of eighty-five percent, and a bias voltage of fifty volts dc applied to the outer two tracks with respect to the center track. During the test, leakage current between the electrodes is measured, and after the test, change of resistance of the tantalum nitride conductors is measured, which is indicative of the degree of electro-oxidation occurring during the test. The greater the change of resistance with time due to the oxidation process, the greater the degree of migration or number of contaminant ions present in the encapsulant.

Figure 3:
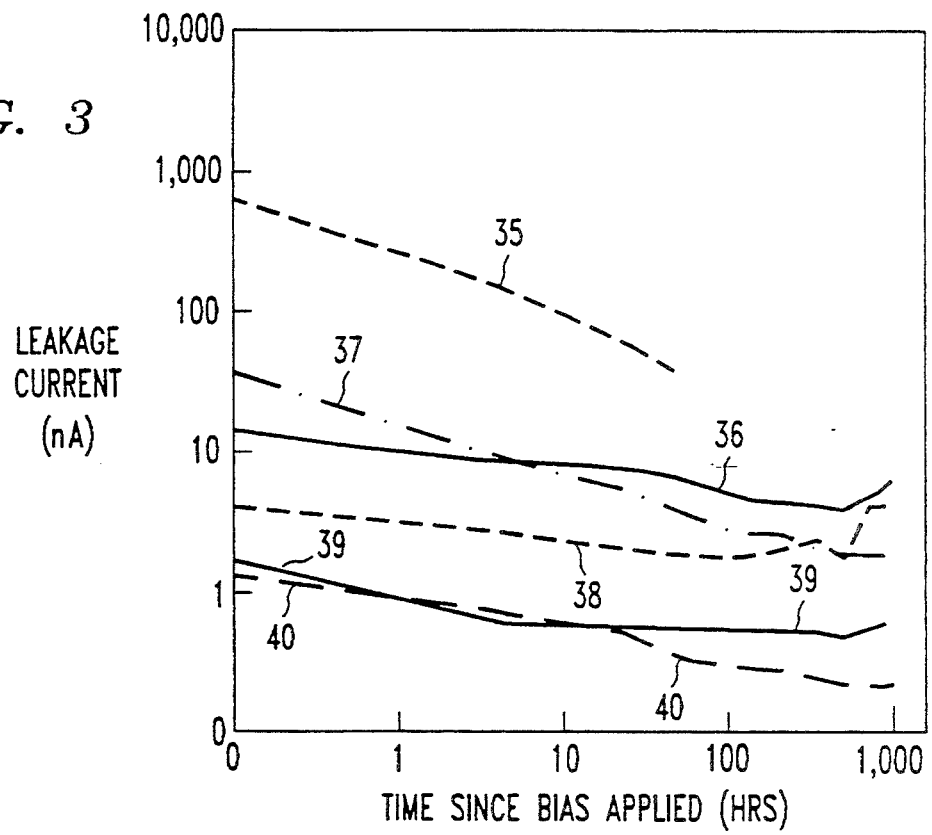
FIG. 3 is a graph of leakage current versus time under a number of different conditions.

Referring to FIG. 3, there is shown a graph of leakage current in nanoamperes versus time. Curve 35 shows the leakage current of the triple track test circuit without any encapsulant, which shows a fairly high leakage current that declines with respect to time. Curve 36 shows leakage current with only an RTV silicone encapsulant. Curve 37 shows the test with only a polyimide encapsulant. One can see that initially the RTV silicone gives a somewhat lower leakage current but, after about four hours, the polyimide gives a lower leakage current. Curve 38 shows the leakage current with a layer of silicon dioxide upon which a layer of RTV silicone resin is formed. One can see that this gives a significantly reduced leakage current. Curve 39 shows the leakage current of an encapsulant of RTV silicone, glass, and RTV silicone, as shown in FIG. 1. Curve 40 illustrates an encapsulant of polyimide, glass, and RTV silicone. One can see that it has a characteristic roughly similar or slightly better than curve 39.

In the experiments, the RTV silicone was hydroxy-terminated polydimethylsiloxane cross-linked with trimethoxysilane using an N-butyl titanate as a catalyst and had a thickness of 1.9 mils (forty-seven micrometers). The glass was $SiO_2$ having a thickness of one thousand two hundred fifty angstroms (one hundred twenty-five nanometers). The polyimide thickness was five micrometers. The glass was deposited with the apparatus of FIG. 2. Typical parameters for glass deposition were: oxygen flow, one hundred seem; helium flow, fifty seem; TEOS temperature, forty degrees Centigrade; system pressure, 0.04 torr; deposition temperature, two hundred ninety-one degrees Centigrade; deposition time, one minute.

Figure 4:
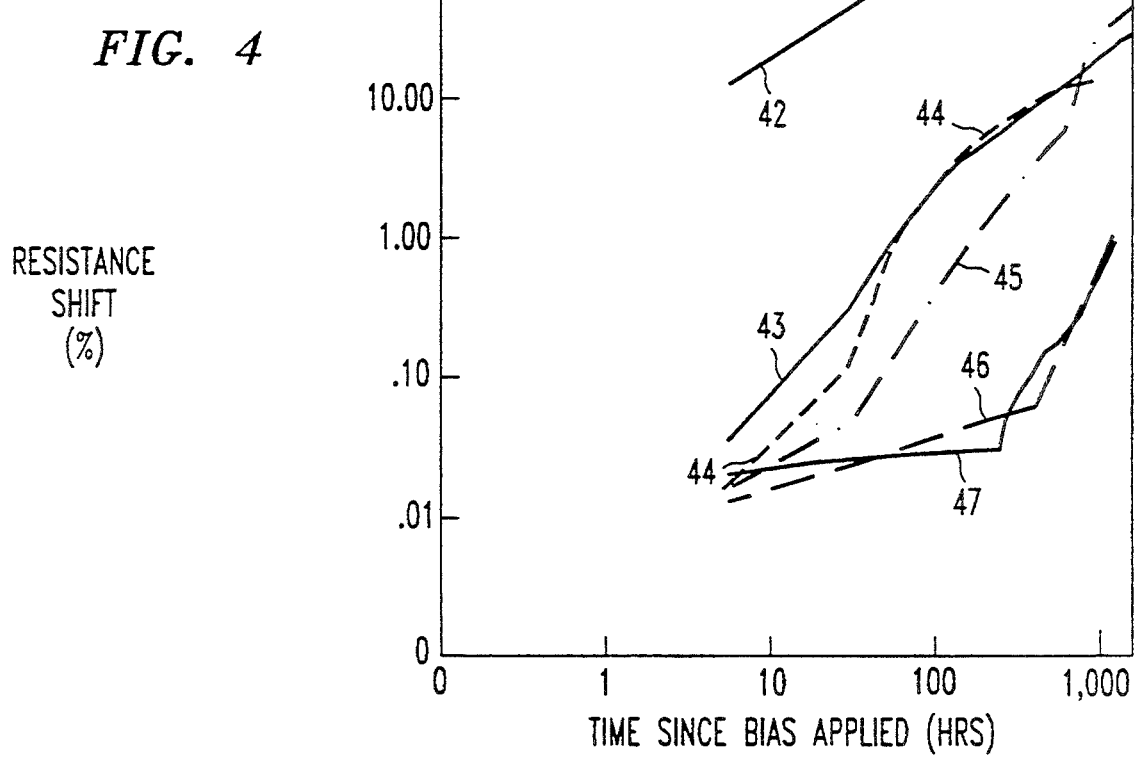
FIG. 4 is a graph of resistance shift versus time under a number of different conditions.

FIG. 4 shows the percent of resistance shift with respect to time for the various experiments described above. Curve 42 shows the resistance shift of the unencapsulated triple track test circuit. Curve 43 shows the resistance shift with an encapsulant only of RTV silicone. Curve 44 shows the characteristic with an encapsulant of polyimide. Curve 45 shows the characteristic with an encapsulant of silicon dioxide plus RTV silicone. Curve 46 represents the encapsulant having a first layer of RTV silicone, a second layer of silicon dioxide, and a third layer of RTV silicone. Curve 47 represents an encapsulant having the first layer of polyimide, the second layer of $SiO_2$ glass, and a third layer of RTV silicone.

Curves 46 and 47, correspond respectively to curves 39 and 40 of FIG. 4 and verify again that the encapsulant structure of FIG. 1 is superior to an encapsulant comprising only polymer for preventing the migration of impurities. As mentioned before, the greater change of resistance with time, the greater the degree of migration or number of contaminant ions which penetrate the encapsulant under test.

While tests have been conducted on RTV silicone, $SiO_2$ glass, and polyimide, it is believed that the tests demonstrate the benefit of alternate glass and polymer layers as an encapsulant. Various polymers and glasses other than those specifically described could therefore be used. Various other embodiments and modifications may be made by those skilled in the art without departing from the spirit and scope of the invention.

We claim:

1. A method for encapsulating a semiconductor device comprising the steps of:
   coating a semiconductor device mounted on a substrate with a first layer of a polymer selected from the group consisting of silicone and polyimide;
   using chemical vapor deposition to coat the first layer with a second layer of glass;

the glass layer being coated to a thickness of less than about five hundred nanometers;

and the polymer being coated to a thickness of greater than about twelve micrometers.

2. The method of claim 1 wherein: the glass is deposited by plasma enhanced chemical vapor deposition.

3. The method of claim 2 wherein: the glass is selected from the group consisting of $SiO_2$, SiN, and SION.

4. The method of claim 3 wherein:

the polymer is a hydroxy-terminated polydimethylsiloxane cross-linked with trimethoxysilane, with N-butyl titanate used as a catalyst.

5. The method of claim 1 wherein:

said glass layer is coated with another polymer layer.

6. The method of claim 5 wherein:

the glass layer is coated by chemical vapor deposition to a thickness less than five hundred nanometers;

and the two polymer layers each have a thickness greater than twelve micrometers.

* * * * *